(12) United States Patent
Kim et al.

(10) Patent No.: US 12,052,898 B2
(45) Date of Patent: Jul. 30, 2024

(54) DISPLAY DEVICE HAVING A TEST TRANSISTOR AND METHOD FOR FABRICATING THE SAME

(71) Applicant: Samsung Display Co., Ltd., Yongin-Si (KR)

(72) Inventors: June Hwan Kim, Daejeon (KR); Yoonho Kim, Asan-si (KR); Tae Young Kim, Seongnam-si (KR); Jongwoo Park, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 326 days.

(21) Appl. No.: 17/397,916

(22) Filed: Aug. 9, 2021

(65) Prior Publication Data
US 2022/0157924 A1    May 19, 2022

(30) Foreign Application Priority Data

Nov. 19, 2020    (KR) ........................ 10-2020-0155742

(51) Int. Cl.
*H10K 59/131*    (2023.01)
*H10K 59/12*    (2023.01)

(52) U.S. Cl.
CPC ..... *H10K 59/1315* (2023.02); *H10K 59/1201* (2023.02)

(58) Field of Classification Search
CPC ....................... H10K 59/1315; H10K 59/1201
USPC ........................................................... 257/40
See application file for complete search history.

(56) References Cited

U.S. PATENT DOCUMENTS

| | | | |
|---|---|---|---|
| 8,723,176 B2 | 5/2014 | Yamazaki | |
| 9,041,202 B2 | 5/2015 | Kimura | |
| 9,564,092 B2 | 2/2017 | Fujioka et al. | |
| 2009/0283762 A1* | 11/2009 | Kimura | H01L 28/40 |
| | | | 257/E33.068 |

\* cited by examiner

*Primary Examiner* — Xia L Cross
(74) *Attorney, Agent, or Firm* — Innovation Counsel LLP

(57) ABSTRACT

A display device may include a driving transistor disposed in a display area, a test transistor disposed in a peripheral area adjacent to the display area, and a resistance line disposed in the peripheral area, electrically connected to the test transistor and including a metal oxide.

11 Claims, 13 Drawing Sheets

FIG. 1
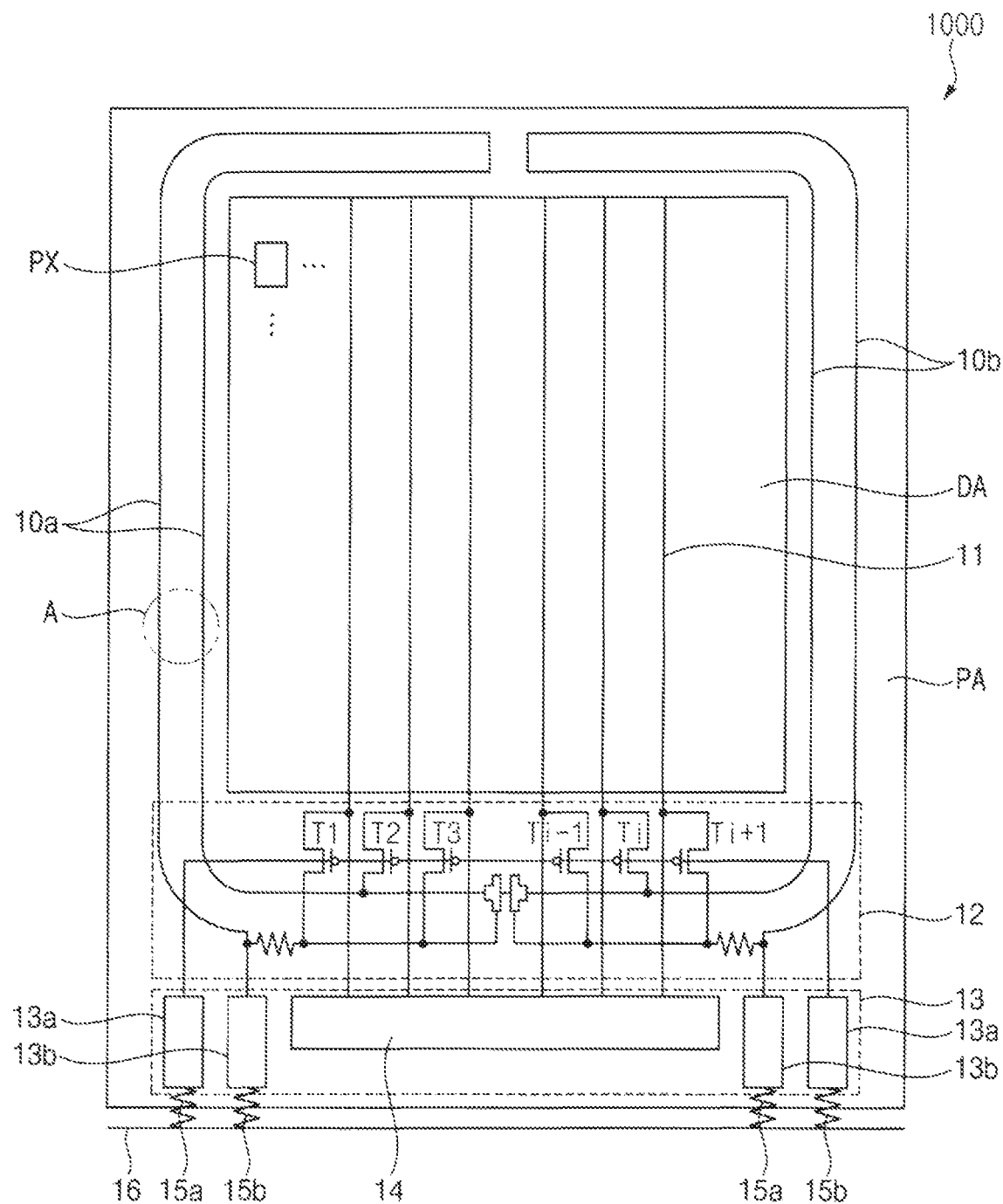
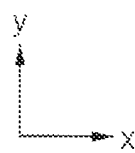

DISPLAY DEVICE HAVING A TEST TRANSISTOR AND METHOD FOR FABRICATING THE SAME

CROSS-REFERENCE TO RELATED APPLICATION

This application claims priority from and the benefit of Korean Patent Application No. 10-2020-0155742, filed on Nov. 19, 2020, which is hereby incorporated by reference for all purposes as if fully set forth herein.

BACKGROUND

1. Field

The present disclosure generally relates to a display device and method for fabricating the same. More particularly, the present disclosure relates to a display device including a resistance line having a metal oxide and method for fabricating the same.

2. Description of the Related Art

In general, a thin film transistor (TFT) is used as switching element for independently driving each pixel in a flat panel display device such as a liquid crystal display (LCD) or an organic light emitting display (OLED). A thin film transistor display panel includes the thin film transistor, a pixel electrode connected to the thin film transistor, a gate line for transferring a gate signal to the thin film transistor, a data line for transferring a data signal, and the like.

The thin film transistor includes a gate electrode connected to the gate line, a source electrode connected to the data line, a drain electrode connected to the pixel electrode, a semiconductor positioned on the gate electrode between the source electrode and the drain electrode, and the like. The thin film transistor transfers the data signal transferred through the data line to the pixel electrode according to the gate signal transferred through the gate line.

Meanwhile, in an area where resistance is required in the display device, a line using an active layer including silicon or a gate metal is formed, and a resistance value is adjusted by a length of the line.

However, in this method, since the resistance value is adjusted only by the length of the line, there is a problem in that space is limited as the length of the line increases.

SUMMARY

Embodiments provide a display device including a resistance line having a metal oxide.

Embodiments provide a method of fabricating the display device.

A display device according to an embodiment may include a driving transistor disposed in a display area, a test transistor disposed in a peripheral area adjacent to the display area, and a resistance line disposed in the peripheral area, electrically connected to the test transistor and including a metal oxide.

In embodiments, the resistance line may include indium-gallium-zinc oxide (IGZO).

In embodiments, the display device may further comprise an inorganic insulating layer covering the resistance line and including at least one through portion adjacent to the resistance line.

In embodiments, the through portion may be filled with an insulating material.

In embodiments, the test transistor may include an active layer including silicon, and a gate electrode disposed on the active layer.

In embodiments, the resistance line may be doped with a P-type impurity.

In embodiments, the resistance line may be doped with boron.

In embodiments, the resistance line may include a first crack detection line and a second crack detection line disposed in the peripheral area.

In embodiments, the resistance line may have a shape surrounding the display area when viewed from a plan view.

In embodiments, at least a portion of the resistance line may have a zigzag shape when viewed from a plan view.

In embodiments, a distance between the through portion and the resistance line may be about 10 µm or less.

A method for fabricating the display device according to an embodiment may provide a substrate including a display area and a peripheral area adjacent to the display area. The method may form an active layer disposed in the display area on the substrate and including a metal oxide. The method may form a resistance line disposed in the peripheral area on the substrate and including a metal oxide. The method may form an inorganic insulating layer covering the active layer and the resistance line. The method may form a contact hole exposing the active layer by removing the inorganic insulating layer. The method may format least one through portion adjacent to the resistance line at the inorganic insulating layer.

In embodiments, the method may further comprise steps of forming an electrode filling the contact hole and forming a passivation layer disposed on the electrode and filling the through portion.

In embodiments, the contact hole and the through portion may be formed in a same process.

In embodiments, the resistance line may include indium-gallium-zinc oxide.

In embodiments, the method may further comprise a step of doping the resistance line with a P-type impurity.

In embodiments, the resistance line may be doped with boron.

In embodiments, the active layer and the resistance line may be formed from a same layer.

In embodiments, the method may further comprise a step of forming an active layer including silicon, which is disposed on the substrate.

In embodiments, the through portion may be spaced apart from the resistance line by about 10 µm or less.

The display device according to an embodiment of the present disclosure may include a resistance line including a metal oxide and an inorganic insulating layer having at least one through portion adjacent to the resistance line. Accordingly, the resistance line may have a required resistance value.

In a method of fabricating the display device according to an embodiment of the present disclosure, the resistance line including a metal oxide and at least one through portion adjacent to the resistance line may be formed. Accordingly, the resistance value of the resistance line may be adjusted according to a distance between the resistance line and the through portion.

BRIEF DESCRIPTION OF THE DRAWINGS

Illustrative, non-limiting embodiments will be more clearly understood from the following detailed description in conjunction with the accompanying drawings.

FIG. 1 is a plan view illustrating a display device according to an embodiment.

DETAILED DESCRIPTION OF THE EMBODIMENTS

Figure 2:
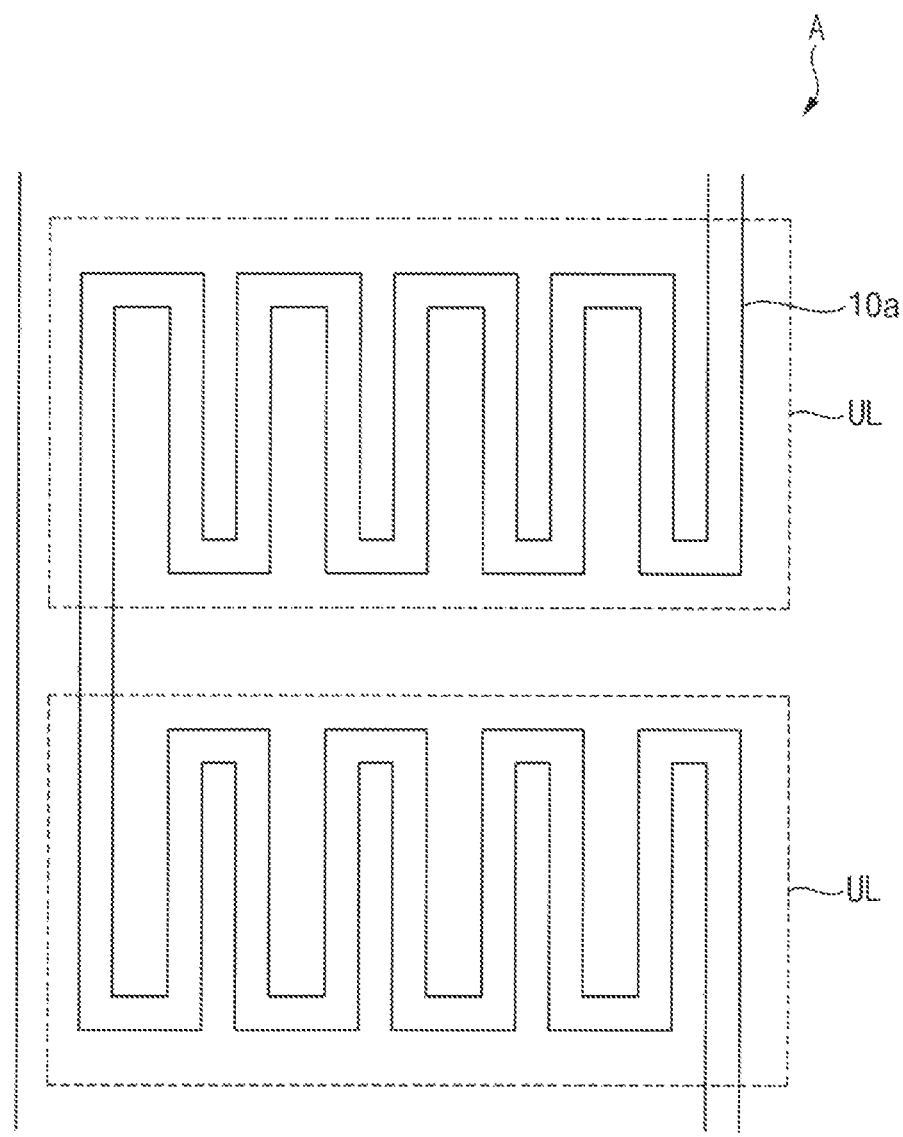
FIG. 2 is a plan view showing an enlarged view of area A of FIG. 1.

Hereinafter, a display device and a method of fabricating the display device according to embodiments will be explained in detail with reference to the accompanying drawings. The same reference numerals are used for the same components in the drawings, and redundant descriptions of the same components will be omitted.

FIG. 1 is a plan view illustrating a display device according to an embodiment.

Referring to FIG. 1, the display device 1000 may include a display area DA and a peripheral area PA.

The display device 1000 may include a display area DA which is an area mainly displaying an image and a peripheral area PA adjacent to the display area DA.

A plurality of pixels PX and a plurality of signal lines may be disposed in the display area DA. The signal lines may include a plurality of data lines 11 transmitting data signals. The plurality of data lines 11 may extend from the display area DA to the peripheral area PA along a y-direction which is perpendicular to an x-direction.

As shown in FIG. 1, the non-display area may be an area positioned outside the display area DA and be referred to as the peripheral area PA, but may include an area displaying an image if necessary. The non-display area may include a peripheral area PA positioned around the display area DA, a circuit area 12, a pad area 13, and the like.

The peripheral area PA positioned around the display area DA may be an area adjacent to the display area DA and surrounding the display area DA. The pad area 13 may be positioned on one end of the display device 1000. The circuit area 12 may include a plurality of electric elements such as transistors, and may be positioned under the lower side of the display area DA.

In an embodiment, the peripheral area PA may include a first crack detection line 10a and a second crack detection line 10b. Each of the first crack detection line 10a and the second crack detection line 10b may be connected to the circuit area 12. Each end of the first crack detection line 10a and the second crack detection line 10b may be connected to the pad area 13, and may receive a test voltage.

In an embodiment, each of the first crack detection line 10a and the second crack detection line 10b may be positioned in the peripheral area PA disposed outside the display area DA. For example, the first crack detection line 10a may be positioned to circumscribe a left outer side of the display area DA, and the second crack detection line 10b may be positioned to circumscribe a right outer side of the display area DA. In other words, each of the first crack detection line 10a and the second crack detection line 10b may have a shape surrounding the display area DA on a plan view.

A plurality of pads that may be electrically connected to the driving chip 14 may be disposed in the pad area 13. The driving chip 14 may be positioned on the display device 1000. The driving chip 14 may include a driver that generates a driving signal for driving the display device 1000. The plurality of pads disposed in the pad area 13 may include input pads 13a and 13b.

The circuit area 12 may be connected to the first crack detection line 10a and the second crack detection line 10b. In addition, a crack detection circuit that may detect defects such as cracks occurring in a substrate or layers stacked on the substrate in the peripheral area PA through a change in resistance of the first crack detection line 10a and the second crack detection line 10b may be disposed in the circuit area 12. The change in resistance of the first crack detection line 10a and the second crack detection line 10b may be confirmed by inspecting a lighting state of the display area DA through the crack detection circuit.

Test transistors T1, T2, T3, . . . Ti−1, Ti, and Ti+1 may be disposed in the circuit area 12. Some of the test transistors T2 and Ti among the test transistors T1, T2, T3, . . . Ti−1, Ti, Ti+1 may be connected each of a first crack detection line 10a and a second crack detection line 10b. Each of the test transistors T1, T2, T3, . . . Ti−1, Ti, and Ti+1 may be connected to a plurality of data lines 11.

Shorting lines 15a and 15b may be connected to each of the input pads 13a and 13b. Each of the shorting lines 15a and 15b may extend from the input pads 13a and 13b to the display device 1000 positioned below the pad area 13.

Although not included in a completed display device 1000, there may be a removal area included in a manufacturing process of the display device 1000 and removed during a cutting process of the display device 1000. A shorting bar 16 which is disposed below the pad area 13 and capable of transmitting a constant voltage such as a ground voltage may be positioned in the removal area. Each of the shorting lines 15a and 15b may be connected to the shorting bar 16 during a manufacturing process, and may transmit a constant voltage such as a ground voltage.

FIG. 2 is a plan view showing an enlarged view of area A of FIG. 1.

Referring to FIG. 2, the first crack detection line 10a may be formed of a plurality of line portion units UL. In addition, although not shown in FIG. 2, the second crack detection line 10b may also be formed of a plurality of line portion units UL.

In an embodiment, each of the first crack detection line 10a and the second crack detection line 10b may be lines that reciprocate in a zigzag shape along one side of the display area DA. Each of the first crack detection line 10a and the second crack detection line 10b may be a single line, and may be positioned to circumference along a periphery of the display area DA.

Figure 3:
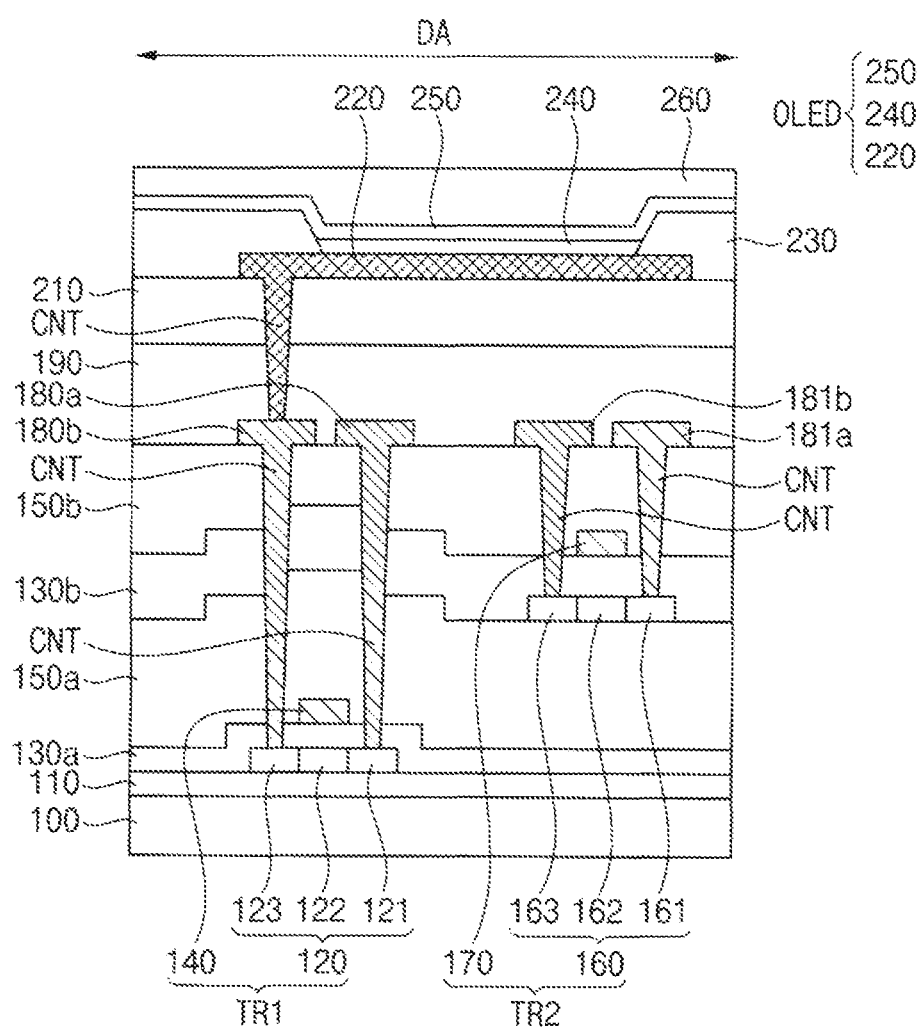
FIG. 3 is a cross-sectional view illustrating a display area of the display device of FIG. 1.

FIG. 3 is a cross-sectional view illustrating a display area of the display device of FIG. 1.

Referring to FIGS. 1 and 3, the display device 1000 may include a substrate 100, a buffer layer 110, a first transistor TR1, a first gate insulating layer 130a, a first interlayer insulating layer 150a, a first source electrode 180a, a first drain electrode 180b, a second transistor TR2, a second gate insulating layer 130b, a second interlayer insulating layer 150b, a second source electrode 181a, a drain electrode 181b, a passivation layer 190, a via layer 210, a pixel defining layer 230, an organic light emitting element OLED, an encapsulation layer 260, and the like.

The first transistor TR1 may include a first active layer 120 and a first gate electrode 140, and the second transistor TR2 may include a second active layer 160 and a second gate electrode 170. The first transistor TR1 may be defined as a driving transistor, and the second transistor TR2 may be defined as a switching transistor.

The organic light emitting element OLED may include a lower electrode 220, an emission layer 240, and an upper electrode 250.

The substrate 100 may include glass, quartz, silicone, polymer resin, and the like. For example, the polymer resin may include polyethylene terephthalate (PET), polyethylene naphthalate (PEN), polycarbonate (PC), polyarylate (PAR), polyethersulfone (PES), polyimide (PI), and the like.

The buffer layer 110 may be disposed on the substrate 100. For example, the buffer layer 110 may include an inorganic material such as oxide or nitride. For example, the buffer layer 110 may have a multilayer structure including a lower layer including silicon nitride (SiNx) and an upper layer including silicon oxide (SiOx).

The first active layer 120 may be disposed on the buffer layer 110. For example, the first active layer 120 may include a silicon-based semiconductor layer. In an embodiment, the first active layer 120 may include polysilicon.

The first active layer 120 may include a first channel area 122, a first source area 121, and a first drain area 123. The first source area 121 may be positioned on one end of the first channel area 122, and the drain area 123 may be positioned on the other end of the first channel area 122. In an embodiment, each of the first source area 121 and the first drain area 123 may be doped with impurities. For example, each of the first source area 121 and the first drain area 123 may be doped with a P-type impurity.

The first gate insulating layer 130a may be disposed on the buffer layer 110. The first gate insulating layer 130a may cover the first active layer 120. For example, the first gate insulating layer 130a may include silicon oxide (SiOx), silicon nitride (SiNx), silicon carbide (SiCx), and the like. Alternatively, the first gate insulating layer 130a may include an insulating metal oxide such as aluminum oxide (AlOx), tantalum oxide (TaOx), hafnium oxide (HfOx), zirconium oxide (ZrOx), and titanium oxide (TiOx), and the like.

The first gate electrode 140 may be disposed on the first gate insulating layer 130a. The first gate electrode 140 may overlap the first active layer 120. Specifically, the first gate electrode 140 may overlap the first channel area 122 of the first active layer 120. For example, the first gate electrode 140 may include a metal, an alloy, a metal nitride, a conductive metal oxide, a transparent conductive material, and the like. These may be used alone or in combination with each other.

The first interlayer insulating layer 150a may be disposed on the first gate insulating layer 130a. For example, the first interlayer insulating layer 150a may include silicon oxide, silicon nitride, metal oxide, and the like.

The second active layer 160 may be disposed on the first interlayer insulating layer 150a. For example, the second active layer 160 may include a metal oxide. For example, the second active layer 160 may include indium (In), zinc (Zn), gallium (Ga), tin (Sn), titanium (Ti), aluminum (Al), hafnium (Hf), zirconium (Zr), magnesium (Mg), and the like. In an embodiment, the second active layer 160 may include indium-gallium-zinc oxide (IGZO).

The second active layer 160 may include a second channel area 162, a second source area 161, and a second drain area 163. The second source area 161 may be positioned on one end of the second channel area 162, and the second drain area 163 may be positioned on the other end of the second channel area 162. In an embodiment, each of the second source area 161 and the second drain area 163 may be doped with impurities. For example, each of the second source area 161 and the second drain area 163 may be doped with P-type impurities.

The second gate insulating layer 130b may be disposed on the first interlayer insulating layer 150a. The second gate insulating layer 130b may cover the second active layer 160. For example, the second gate insulating layer 130b may include silicon oxide, silicon nitride, silicon carbide, and the like. Alternatively, the second gate insulating layer 130b may include an insulating metal oxide such as aluminum oxide, tantalum oxide, hafnium oxide, zirconium oxide, titanium oxide, and the like.

The second gate electrode 170 may be disposed on the second gate insulating layer 130b. The second gate electrode 170 may overlap the second active layer 160. Specifically, the gate electrode 170 may overlap the second channel area 162 of the second active layer 160. For example, the second gate electrode 170 may include a metal, an alloy, a metal nitride, a conductive metal oxide, a transparent conductive material, and the like. These may be used alone or in combination with each other.

The second interlayer insulating layer 150b may be disposed on the second gate insulating layer 130b. The second interlayer insulating layer 150b may cover the second gate electrode 170. For example, the second interlayer insulating layer 150b may include silicon oxide, silicon nitride, metal oxide, and the like.

The first source electrode 180a and the first drain electrode 180b may be disposed on the second interlayer insulating layer 150b. The first source electrode 180a and the first drain electrode 180b may be connected to the first source area 121 and the first drain area 123 through contact holes CNT formed by removing a portion of the first gate insulating layer 130a, the first interlayer insulating layer 150a, the second gate insulating layer 130b, and the second interlayer insulating layer 150b. For example, each of the first source electrode 180a and the first drain electrode 180b may include a metal, an alloy, a metal nitride, a conductive metal oxide, a transparent conductive material, and the like. These may be used alone or in combination with each other.

The second source electrode 181a and the second drain electrode 181b may be disposed on the second interlayer insulating layer 150b. The second source electrode 181a and the second drain electrode 181b may be connected to the second source area 161 and the second drain area 163 through contact holes CNT formed by removing a portion of the second gate insulating layer 130b and the second interlayer insulating layer 150b. For example, each of the second source electrode 181a and the second drain electrode 181b may include a metal, an alloy, a metal nitride, a conductive metal oxide, a transparent conductive material, and the like. These may be used alone or in combination with each other.

The passivation layer 190 may be disposed on the second interlayer insulating layer 150b. The passivation layer 190 may cover the first source electrode 180a, the first drain electrode 180b, the second source electrode 181a, and the second drain electrode 181b. The passivation layer 190 may include an insulating material. For example, the passivation layer 190 may include silicon nitride, silicon oxide, silicon oxynitride, and the like.

The via layer 210 may be disposed on the passivation layer 190. For example, the via layer 210 may include an organic insulating material. For example, the via layer 210 may include a phenol resin, an acrylic resin, a polyimide resin, a polyamide resin, a siloxane resin, an epoxy resin, and the like.

The lower electrode 220 may be disposed on the via layer 210. The lower electrode 220 may be connected to the first drain electrode 180b through a contact hole CNT formed by removing a portion of the via layer 210 and the passivation layer 190. For example, the lower electrode 220 may include a metal, an alloy, a metal nitride, a conductive metal oxide, a transparent conductive material, and the like. These may be used alone or in combination with each other.

The pixel defining layer 230 may be disposed on the via layer 210. An opening exposing at least a portion of the lower electrode 220 is defined or formed in the pixel defining layer 230. For example, the pixel defining layer 230 may include an organic insulating material.

The emission layer 240 may be disposed on the lower electrode 220. The emission layer 240 may be formed using at least one of light emitting materials capable of emitting red light, green light, and blue light. The emission layer 240 may include a hole injection layer, a hole transport layer, an organic emission layer, an electron transport layer, an electron injection layer, and the like. For example, the emission layer 240 may include a low molecular weight organic compound or a high molecular weight organic compound.

The upper electrode 250 may be disposed on the emission layer 240 and the pixel defining layer 230. The upper electrode 250 may include a metal, an alloy, a metal nitride, a conductive metal oxide, a transparent conductive material, and the like. These may be used alone or in combination with each other.

The encapsulation layer 260 may be disposed on the upper electrode 250. The encapsulation layer 260 may have a stacked structure of an inorganic layer and an organic layer. For example, the organic layer may include a cured polymer such as polyacrylate. For example, the inorganic layer may include silicon oxide, silicon nitride, silicon carbide, aluminum oxide, tantalum oxide, hafnium oxide, zirconium oxide, titanium oxide, and the like.

Figure 4:
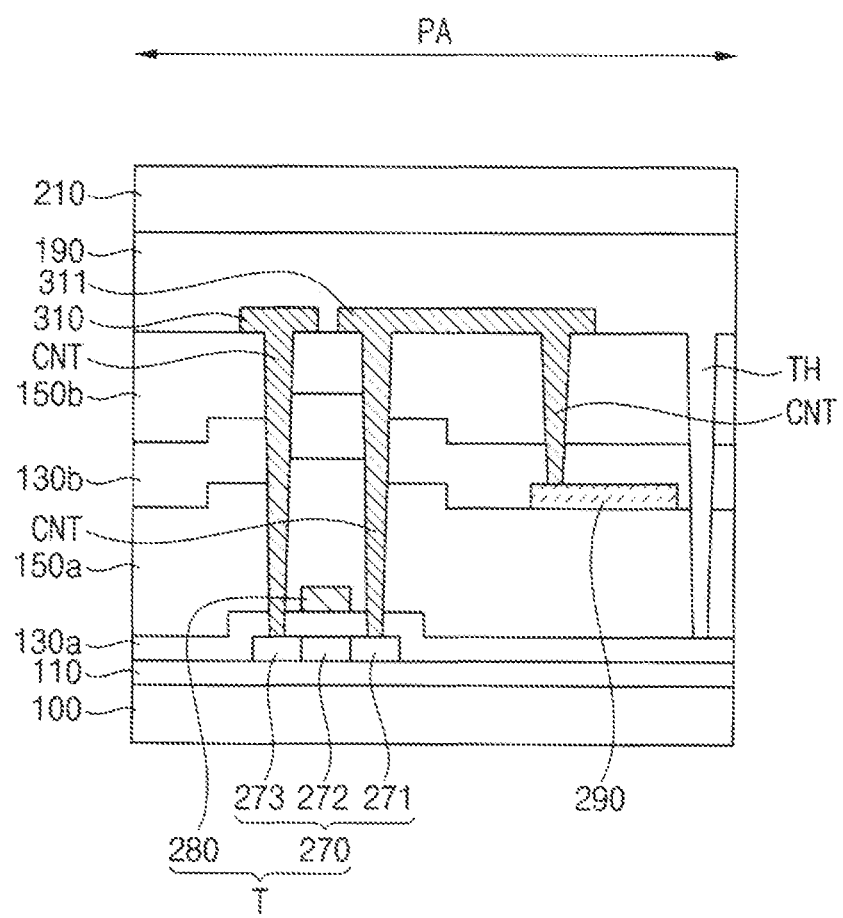
FIG. 4 is a cross-sectional view illustrating a circuit area positioned in a peripheral area of the display device of FIG. 1.

FIG. 4 is a cross-sectional view illustrating a circuit area positioned in a peripheral area of the display device of FIG. 1.

Referring to FIG. 4, the display device 1000 may include the substrate 100, the buffer layer 110, a test transistor T, the first gate insulating layer 130a, the first interlayer insulating layer 150a, the second gate insulating layer 130b, the second interlayer insulating layer 150b, a first electrode 310, a second electrode 311, a resistance line 290, a through portion TH, the passivation layer 190, the via layer 210, and the like. The test transistor T may include a third active layer 270 and a third gate electrode 280. The test transistor T may include any one of the test transistors T1, T2, T3, . . . Ti−1, Ti, and Ti+1 shown in FIG. 1.

The buffer layer 110 may be disposed on the substrate 100, and the third active layer 270 may be disposed on the buffer layer 110. The third active layer 270 may include a silicon-based semiconductor layer. In an embodiment, the third active layer 270 may include polysilicon. The third active layer 270 may include a channel area 272, a first area 271 and a second area 273. The first area 271 and the second area 273 may be positioned on both sides of the channel area 272. For example, each of the first region 271 and the second region 273 may be doped with impurities. For example, each of the first region 271 and the second region 273 may be doped with a P-type impurity.

The first gate insulating layer 130a may be disposed on the buffer layer 110. For example, the first gate insulating layer 130a may include silicon oxide, silicon nitride, and the like. The third gate electrode 280 may be disposed on the first gate insulating layer 130a. The third gate electrode 280 may overlap the third active layer 270. The first interlayer insulating layer 150a may be disposed on the first gate insulating layer 130a. For example, the first interlayer insulating layer 150a may include silicon oxide, silicon nitride, and the like.

In an embodiment, the resistance line 290 may be disposed on the first interlayer insulating layer 150a. The resistance line 290 may include a metal oxide. For example, the resistance line 290 may include In, Zn, Ga, Sn, Ti, Al, Hf, Zr, Mg, and the like. In an embodiment, the resistance line 290 may include indium-gallium-zinc oxide (IGZO).

Impurities may be doped into the resistance line 290. For example, the resistance line 290 may be doped with a P-type impurity. In an embodiment, the resistance line 290 may be doped with boron (B). Alternatively, the resistance line 290 may not be doped with boron. Accordingly, when the resistance line 290 is doped with boron, a resistance value of the resistance line 290 may be greater than when the resistance line 290 is not doped with boron.

In an embodiment, referring again to FIG. 1, the resistance line 290 may include the first crack detection line 10a and the second crack detection line 10b. When the resistance line 290 includes the first crack detection line 10a, the resistance line 290 may be electrically connected to the second test transistor T2. When the resistance line 290 includes the second crack detection line 10b, the resistance line 290 may be electrically connected to the ith test transistor Ti. Alternatively, when the resistance line 290 includes the first crack detection line 10a and the second crack detection line 10b, the resistance line 290 may be electrically connected to at least one of test transistors T1, T2, T3, . . . Ti−1, Ti, and Ti+1. However, the configuration of the present disclosure is not limited thereto, and the resistance line 290 may include other line requiring resistance positioned in the display area DA or the peripheral area PA.

The second gate insulating layer 130b may be disposed on the first interlayer insulating layer 150a. The second gate insulating layer 130b may cover the resistance line 290. For example, the second gate insulating layer 130b may include silicon oxide, silicon nitride, and the like. The second interlayer insulating layer 150b may be disposed on the second gate insulating layer 130b. For example, the second interlayer insulating layer 150b may include silicon oxide, silicon nitride, and the like.

The first electrode 310 and the second electrode 311 may be disposed on the second interlayer insulating layer 150b.

The first electrode 310 and the second electrode 311 may be connected to the first area 271 and the second area 273 of the third active layer 270 through contact holes CNT formed by removing a portion of the first gate insulating layer 130a, the first interlayer insulating layer 150a, the second gate insulating layer 130b, and the second interlayer insulating layer 150b. The resistance line 290 may be connected to the second electrode 311 through a contact hole CNT formed by removing portion of the second interlayer insulating layer 150b and the second gate insulating layer 130b. For example, each of the first electrode 310 and the second electrode 311 may include a metal, an alloy, a metal nitride, a conductive metal oxide, a transparent conductive material, and the like. These may be used alone or in combination with each other.

In an embodiment, when the resistance line 290 includes the first crack detection line 10a, the first electrode 310 may include the data line 11 electrically connected to the second test transistor T2. Alternatively, when the resistance line 290 includes the second crack detection line 10b, the first electrode 310 may include the data line 11 electrically connected to the ith test transistor Ti (see FIG. 1).

In an embodiment, when the resistance line 290 includes the first crack detection line 10a, the resistance line 290 may be electrically connected to the second test transistor T2 through the second electrode 311. Alternatively, when the resistance line 290 includes the second crack detection line 10b, the resistance line 290 may be electrically connected to the ith test transistor Ti through the second electrode 311 (see FIG. 1).

In an embodiment, the inorganic insulating layer (e.g., the first interlayer insulating layer 150a, the second gate insulating layer 130b, and the second interlayer insulating layer 150b) may have at least one though portion TH adjacent to the resistance line 290. For example, the through portion TH may be filled with an insulating material. For example, the through portion TH may be filled with an inorganic insulating material, and the like.

The passivation layer 190 may be disposed on the second interlayer insulating layer 150b. The passivation layer 190 may serve to protect the first electrode 310 and the second electrode 311. The via layer 210 may be disposed on the passivation layer 190. For example, the via layer 210 may include an organic insulating material.

In the display device 1000 of the present disclosure, the resistance line 290 may include a metal oxide, boron may be doped in the resistance line 290, and the inorganic insulating layer may have at least one though portion TH adjacent to the resistance line 290. Accordingly, the resistance line 290 may have a required resistance value.

Figure 5:
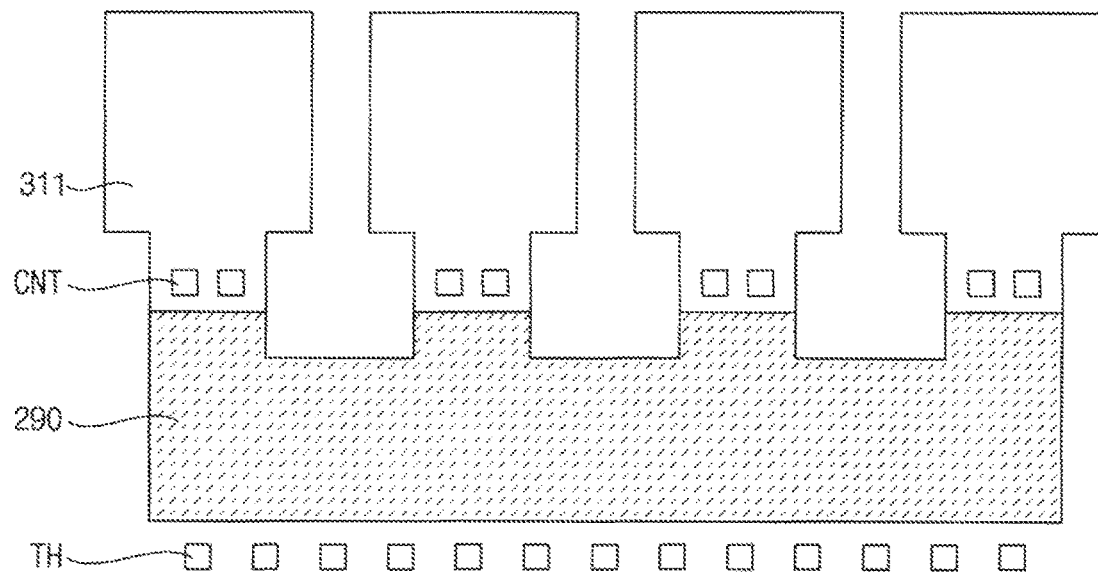
FIG. 5 is a diagram illustrating a resistance line and through portions of FIG. 4.
Figure 6:
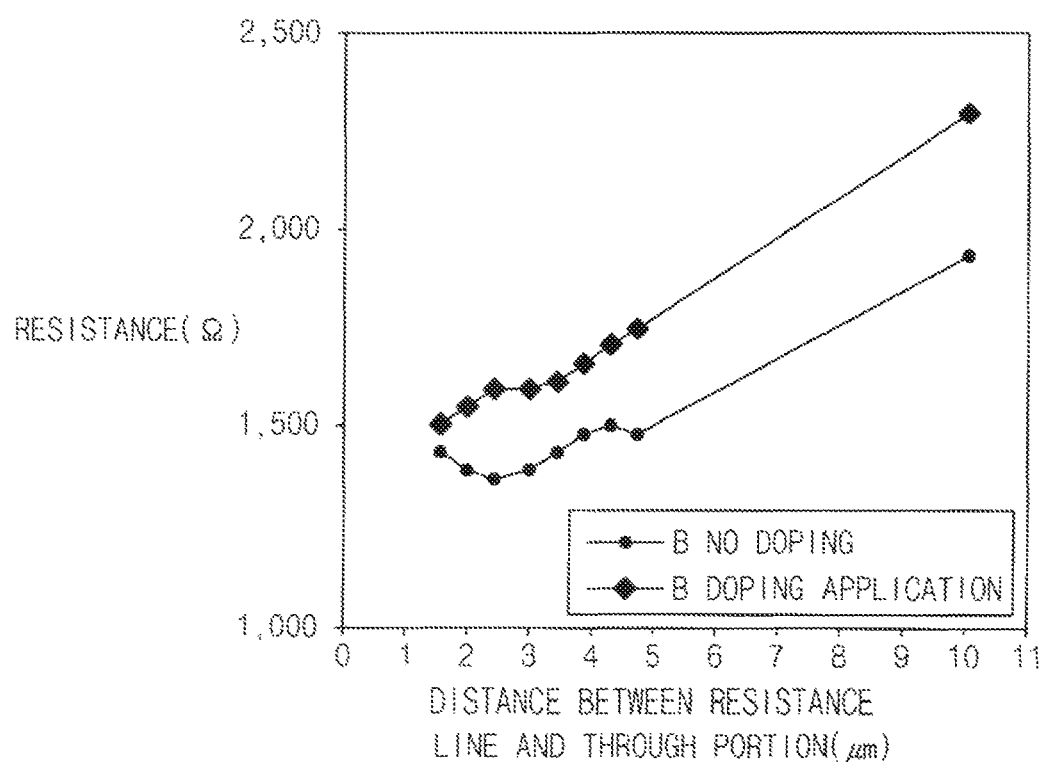
FIG. 6 is a diagram illustrating a resistance value of the resistance line according to a distance between the resistance line and the through portions of FIG. 5.

FIG. 5 is a diagram illustrating a resistance line and through portions of FIG. 4. FIG. 6 is a diagram illustrating a resistance value of the resistance line according to a distance between the resistance line and the through portions of FIG. 5.

Referring to FIG. 5, at least one the through portion TH adjacent to the resistance line 290 may be formed. In other words, the through portion TH may be formed in a plural number.

Referring to FIG. 6, the resistance value of the resistance line 290 may vary according to a distance between the resistance line 290 and the through portion TH. Additionally, the resistance value of the resistance line 290 may vary depending on whether or not the resistance line 290 is doped with boron. Accordingly, the resistance line 290 may be formed to have a required resistance value by adjusting a distance between the resistance line 290 and the through portion TH or by controlling doping.

In an embodiment, when the resistance line 290 is not doped with boron and a distance between the resistance line 290 and the through portion TH is about 1 μm to about 10 μm, the resistance value of the resistance line 290 may be about 1,300Ω to about 2,000Ω.

In an embodiment, when the resistance line 290 is doped with boron, and a distance between the resistance line 290 and the through portion TH is about 1 μm to about 10 μm, the resistance value of the resistance line 290 may be about 1,500Ω to about 2,300Ω.

Figure 7:
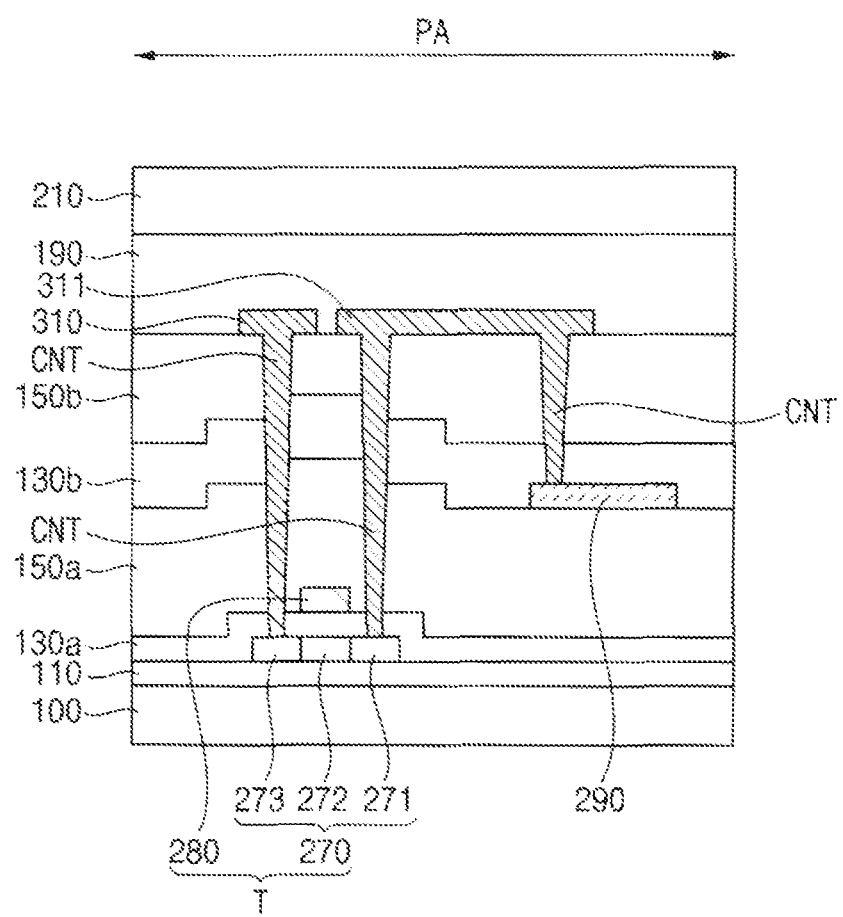
FIG. 7 is a cross-sectional view illustrating a circuit area positioned in a peripheral area of a display device according to an embodiment.

FIG. 7 is a cross-sectional view illustrating a circuit area positioned in a peripheral area of a display device according to an embodiment.

Referring to FIG. 7, the display device may include a substrate 100, a buffer layer 110, a first gate insulating layer 130a, a first interlayer insulating layer 150a, a test transistor T, a second gate insulating layer 130b, a second interlayer insulating layer 150b, a resistance line 290, a first electrode 310, a second electrode 311, a passivation layer 190, a via layer 210, and the like. The test transistor T may include a third active layer 270 and a third gate electrode 280. However, the display device of FIG. 7 may be substantially equal to the display device 1000 of FIG. 4 except that there is no at least one through portion adjacent to the resistance line 290. Hereinafter, it will be mainly described that there is no the through portion adjacent to the resistance line 290.

In an embodiment, the through portion may be disposed to be spaced apart from the resistance line 290. That is, the through portion adjacent to the resistance line 290 may not be disposed. In other words, the through portion may be disposed to be spaced apart from the resistance line 290 by about 10 μm or more.

In the display device of the present disclosure, the resistance line 290 may include a metal oxide, boron may be doped in the resistance line 290, and the through portion may be disposed to be spaced apart from the resistance line 290. Accordingly, the resistance line 290 may have a required resistance value.

Figure 8:
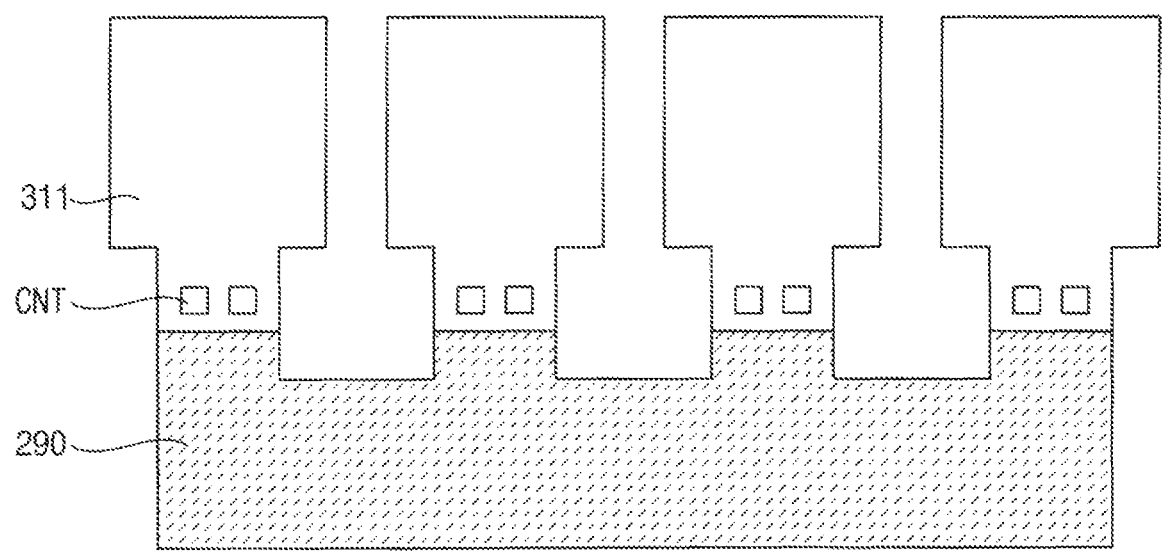
FIG. 8 is a diagram illustrating a resistance line of FIG. 7.

FIG. 8 is a diagram illustrating a resistance line of FIG. 7.

Referring to FIG. 8, the through portion may be formed to be spaced apart from the resistance line 290. In other words, the through portion may not be formed around the resistance line 290. For example, the through portion may be spaced apart from the resistance line 290 by about 10 μm or more. Accordingly, the resistance line 290 may be formed to have a required resistance value by adjusting a distance between the resistance line 290 and the through portion or by controlling doping.

FIGS. 9, 10, 11, 12, 13, and 14 are cross-sectional views illustrating a method of fabricating a display device according to an embodiment.

Figure 9:
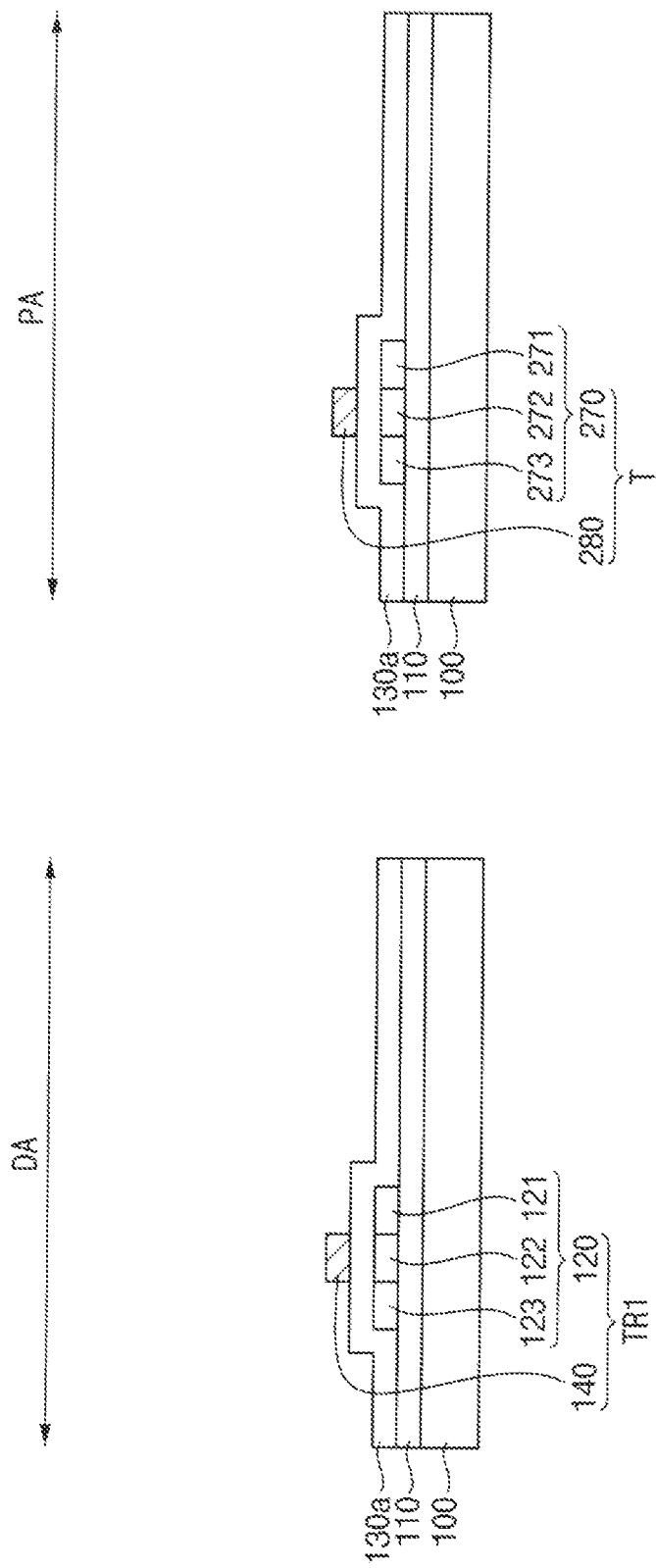
FIGS. 9, 10, 11, 12, 13, and 14 are cross-sectional views illustrating a method of fabricating a display device according to an embodiment.

Referring to FIG. 9, the substrate 100 including a display area DA and a peripheral area PA adjacent to the display area DA may be provided. For example, the substrate 100 may be formed using glass, quartz, silicon, polymer resin, and the like.

The buffer layer 110 may be formed on the substrate 100. In other words, the buffer layer 110 may be entirely formed in the display area DA and the peripheral area PA. For example, the buffer layer 110 may be formed using an inorganic material such as oxide or nitride.

The first active layer 120 may be formed in the display area DA on the buffer layer 110, and the third active layer 270 may be formed in the peripheral area PA on the buffer layer 110. For example, each of the first active layer 120 and the third active layer 270 may be formed using a silicon-based semiconductor layer. In an embodiment, each of the first active layer 120 and the third active layer 270 may be formed using polysilicon. In other words, each of the first active layer 120 and third active layers 270 may be simultaneously formed using polysilicon.

The first gate insulating layer 130a may be formed on the buffer layer 110. The first gate insulating layer 130a may cover the first active layer 120 and the third active layer 270. In other words, the first gate insulating layer 130a may be entirely formed in the display area DA and the peripheral area PA. For example, the first gate insulating layer 130*a* may be formed using silicon oxide, silicon nitride, and the like.

The first gate electrode 140 may be formed in the display area DA on the first gate insulating layer 130*a*, and the third gate electrode 280 may be formed in the peripheral area PA on the first gate insulating layer 130*a*. The first gate electrode 140 may overlap the first active layer 120, and the third gate electrode 280 may overlap the third active layer 270. For example, each of the first gate electrode 140 and the third gate electrode 280 may be formed using a metal, an alloy, a metal nitride, a conductive metal oxide, a transparent conductive material, and the like. These may be used alone or in combination with each other.

Figure 10:
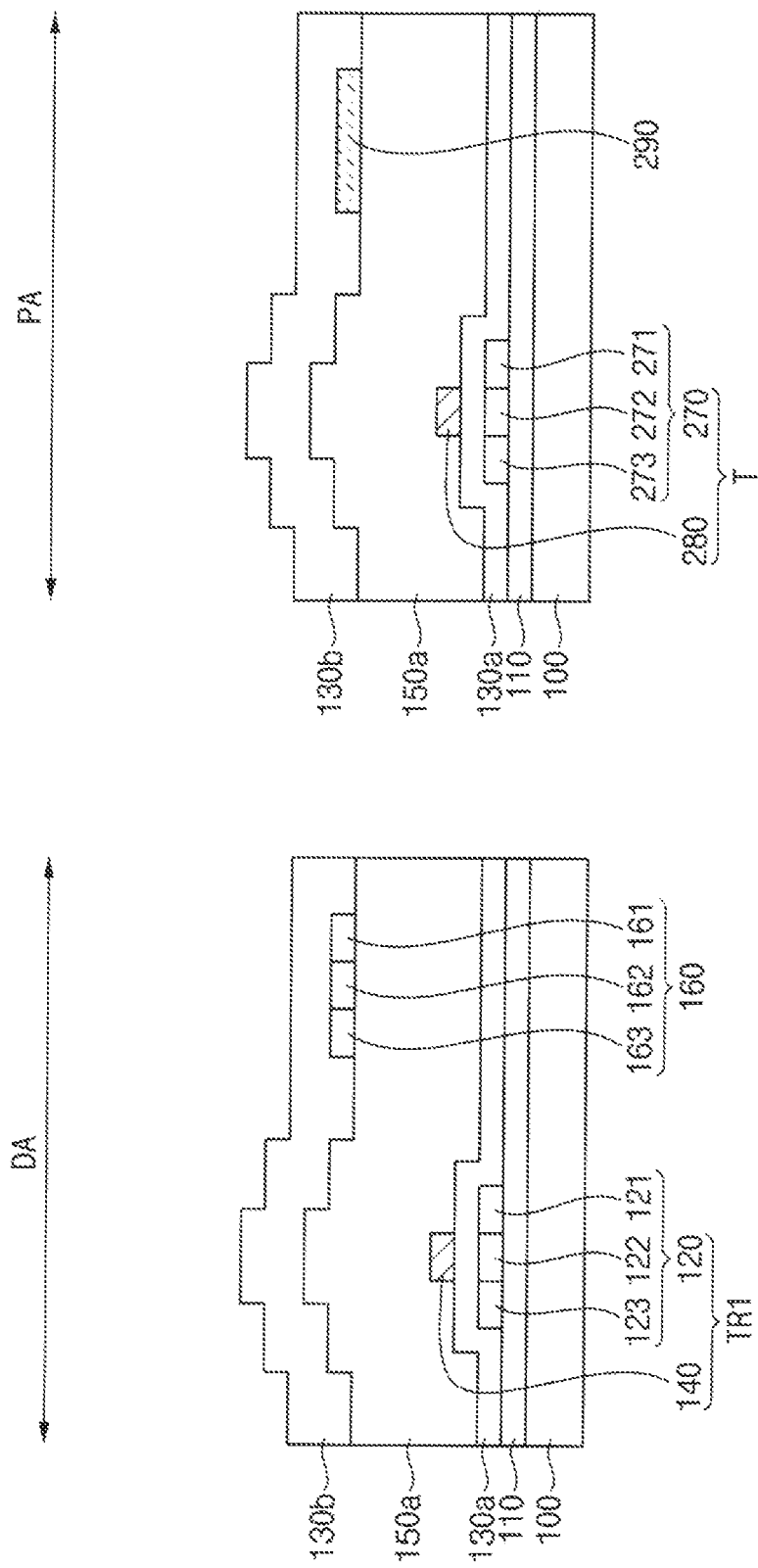

Referring to FIG. 10, the first interlayer insulating layer 150*a* may be formed on the first gate insulating layer 130*a*. The first interlayer insulating layer 150*a* may cover the first gate electrode 140 and the third gate electrode 280. In other words, the first interlayer insulating layer 150*a* may be entirely formed in the display area DA and the peripheral area PA. For example, the first interlayer insulating layer 150*a* may be formed using silicon oxide, silicon nitride, and the like.

The second active layer 160 may be formed in the display area DA on the first interlayer insulating layer 150*a*. For example, the second active layer 160 may be formed using a metal oxide. In an embodiment, the second active layer 160 may be formed using indium-gallium-zinc oxide (IGZO).

The resistance line 290 may be formed in the peripheral area PA on the first interlayer insulating layer 150*a*. For example, the resistance line 290 may be formed using a metal oxide. In other words, each of the resistance line 290 and the second active layer 160 may be simultaneously formed using a metal oxide. In an embodiment, the resistance line 290 may be formed using indium-gallium-zinc oxide (IGZO).

The first active layer 120 and the first gate electrode 140 may be defined as the first transistor TR1, and the third active layer 270 and the third gate electrode 280 may be defined as the test transistor T. The test transistor T may include any one of the test transistors T1, T2, T3, . . . Ti−1, Ti, and Ti+1 shown in FIG. 1.

The second gate insulating layer 130*b* may be formed on the first interlayer insulating layer 150*a*. The second gate insulating layer 130*b* may be entirely formed in the display area DA and the peripheral area PA. The second gate insulating layer 130*b* may cover the second active layer 160 in the display area DA, and the second gate insulating layer 130*b* may cover the resistance line 290 in the peripheral area PA. For example, the second gate insulating layer 130*b* may be formed using silicon oxide, silicon nitride, and the like.

Figure 11:
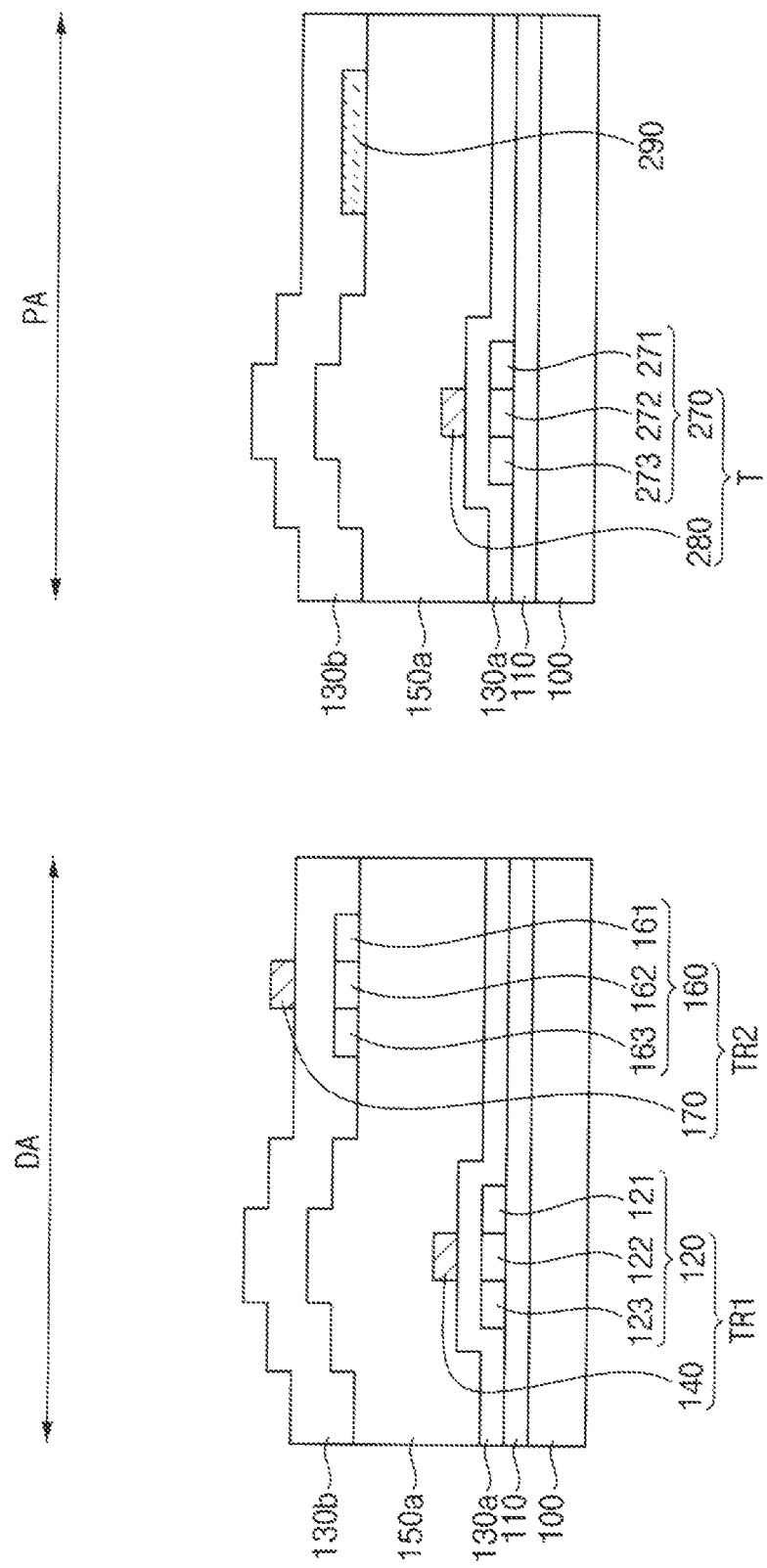

Referring to FIG. 11, the second gate electrode 170 may be formed on the second gate insulating layer 130*b*. The second gate electrode 170 may overlap the second active layer 160. For example, the second gate electrode 170 may be formed using a metal, an alloy, a metal nitride, a conductive metal oxide, a transparent conductive material, and the like. These may be used alone or in combination with each other.

The second active layer 160 and the second gate electrode 170 may be defined as the second transistor T2.

Impurities may be doped into the resistance line 290. For example, the resistance line 290 may be doped with a P-type impurity. In an embodiment, the resistance line 290 may be doped with boron. Alternatively, the resistance line 290 may not be doped with boron. Accordingly, the resistance value of the resistance line 290 may be adjusted.

Figure 12:
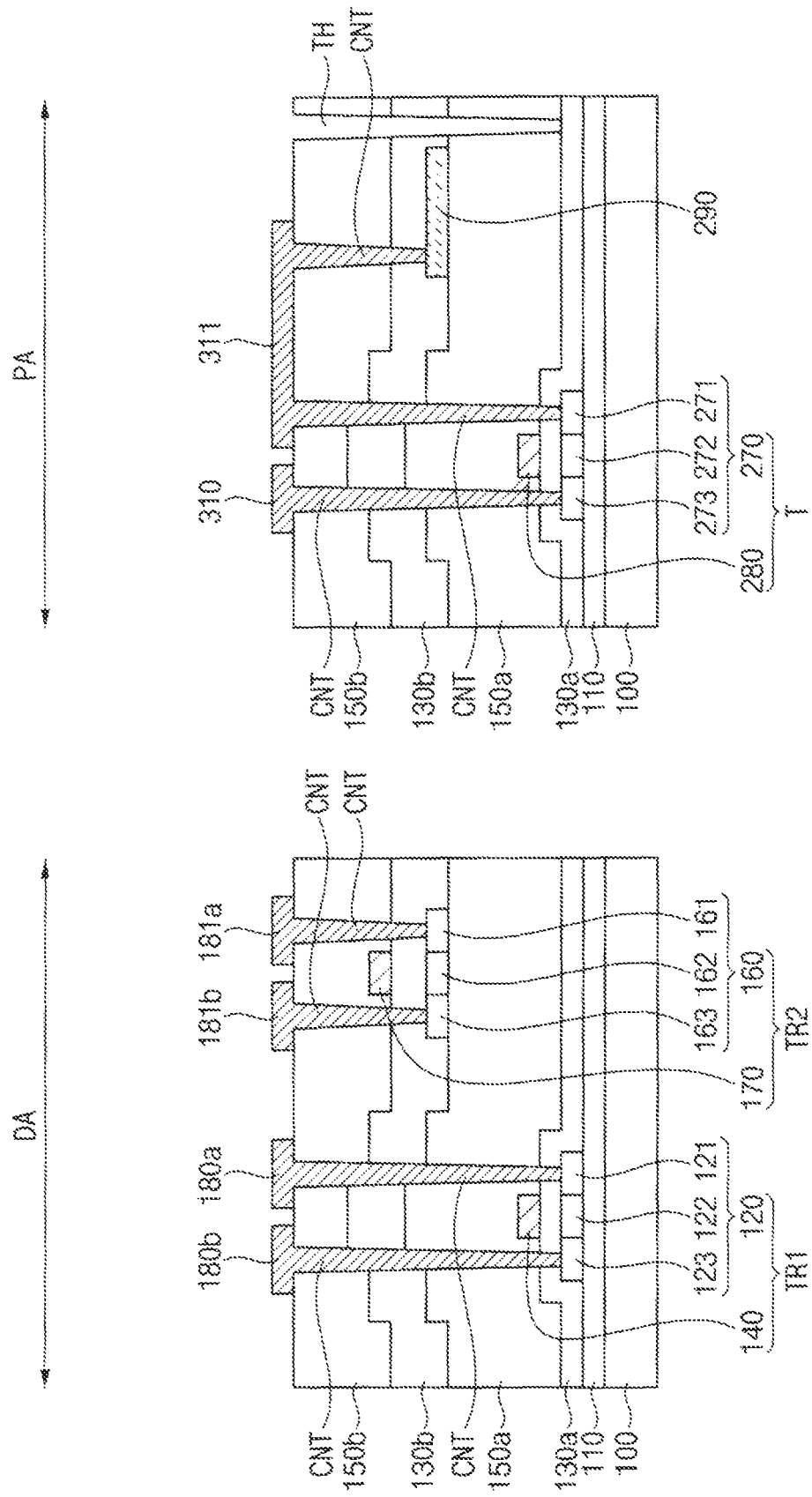

Referring to FIG. 12, the second interlayer insulating layer 150*b* may be formed on the second gate insulating layer 130*b*. The second interlayer insulating layer 150*b* may be entirely formed in the display area DA and the peripheral area PA. The second interlayer insulating layer 150*b* may cover the second gate electrode 170 in the display area DA. For example, the second interlayer insulating layer 150*b* may be formed using silicon oxide, silicon nitride, and the like.

The first source electrode 180*a* and the first drain electrode 180*b* may be formed in the display area DA on the second interlayer insulating layer 150*b*. The first source electrode 180*a* and the first drain electrode 180*b* may be connected to the first source area 121 and the first drain area 123 of the first active layer 120 though contact holes CNT formed by removing a portion of an inorganic insulating layer (e.g., the first gate insulating layer 130*a*, the first interlayer insulating layer 150*a*, the second gate insulating layer 130*b*, and the second interlayer insulating layer 150*b*). In other words, the first source electrode 180*a* and the first drain electrode 180*b* may be formed in the display area DA on the second interlayer insulating layer 150*b* by filling the contact holes CNT with a conductive material. For example, each of the first source electrode 180*a* and the first drain electrode 180*b* may be formed using a metal, an alloy, a metal nitride, a conductive metal oxide, a transparent conductive material, and the like. These may be used alone or in combination with each other.

The second source electrode 181*a* and the second drain electrode 181*b* may be formed in the display area DA on the second interlayer insulating layer 150*b*. The second source electrode 181*a* and the second drain electrode 181*b* may be connected to the second source area 161 and the second drain area 163 of the second active layer 160 though contact holes CNT formed by removing a portion of the inorganic insulating layer (e.g., the second gate insulating layer 130*b* and the second interlayer insulating layer 150*b*). In other words, the second source electrode 181*a* and the second drain electrode 181*b* may be formed in the display area DA on the second interlayer insulating layer 150*b* by filling the contact holes CNT with a conductive material. For example, each of the second source electrode 181*a* and the second drain electrode 181*b* may be formed of a metal, an alloy, a metal nitride, a conductive metal oxide, a transparent conductive material, and the like. These may be used alone or in combination with each other.

The first electrode 310 and the second electrode 311 may be formed in the peripheral area PA on the second interlayer insulating layer 150*b*. The first electrode 310 and the second electrode 311 may be connected to the first area 271 and the second area 273 of the active layer 270 through contact holes CNT formed by removing a portion of an inorganic insulating layer (e.g., the first gate insulating layer 130*a*, the first interlayer insulating layer 150*a*, the second gate insulating layer 130*b*, and the second interlayer insulating layer 150*b*). In additional, the second electrode 311 may be connected to the resistance line 290 through a contact hole CNT. In other words, the first electrode 310 and the second electrode 311 may be formed in the peripheral area PA on the second interlayer insulating layer 150*b* by filling the contact hole (e.g., the contact hole CNT, etc.) with a conductive material. For example, each of the first electrode 310 and the second electrode 311 may be formed using a metal, an alloy, a metal nitride, a conductive metal oxide, a transparent conductive material, and the like. These may be used alone or in combination with each other.

In an embodiment, when the resistance line 290 includes the first crack detection line 10a, the test transistor T may be the second test transistor T2. In this case, the resistance line 290 may be electrically connected to the second test transistor T2 through the second electrode 311, and the first electrode 310 may include a data line 11 electrically connected to the second test transistor T2 (see FIG. 1).

In an embodiment, when the resistance line 290 includes the second crack detection line 10b, the test transistor T may be the i-th test transistor Ti. In this case, the resistance line 290 may be electrically connected to the ith test transistor Ti through the second electrode 311, and the first electrode 310 may include the data line 11 electrically connected to the ith test transistor Ti (see FIG. 1).

In an embodiment, at least one through portion TH adjacent to the resistance line 290 may be formed by removing a portion of the inorganic insulating layer (e.g., the first interlayer insulating layer 150a, the second gate insulating layer 130b, and the second interlayer insulating layer 150b). In other words, the through portion TH may be formed simultaneously with the contact holes (e.g., the contact hole CNT, etc.). For example, the through portion TH may be filled with an insulating material. In other words, a portion of the insulating material may be filled in the through portion TH. For example, the through portion TH may be filled with an inorganic insulating material, and the like.

In an embodiment, the through portion TH may be spaced apart from the resistance line 290 by about 10 μm or less. In other words, a distance between the through portion TH and the resistance line 290 may be about fpm to about 10 μm. Alternatively, the through portion TH may be spaced apart from the resistance line 290 by about 10 μm or more. Accordingly, the resistance value of the resistance line 290 may be adjusted.

Figure 13:
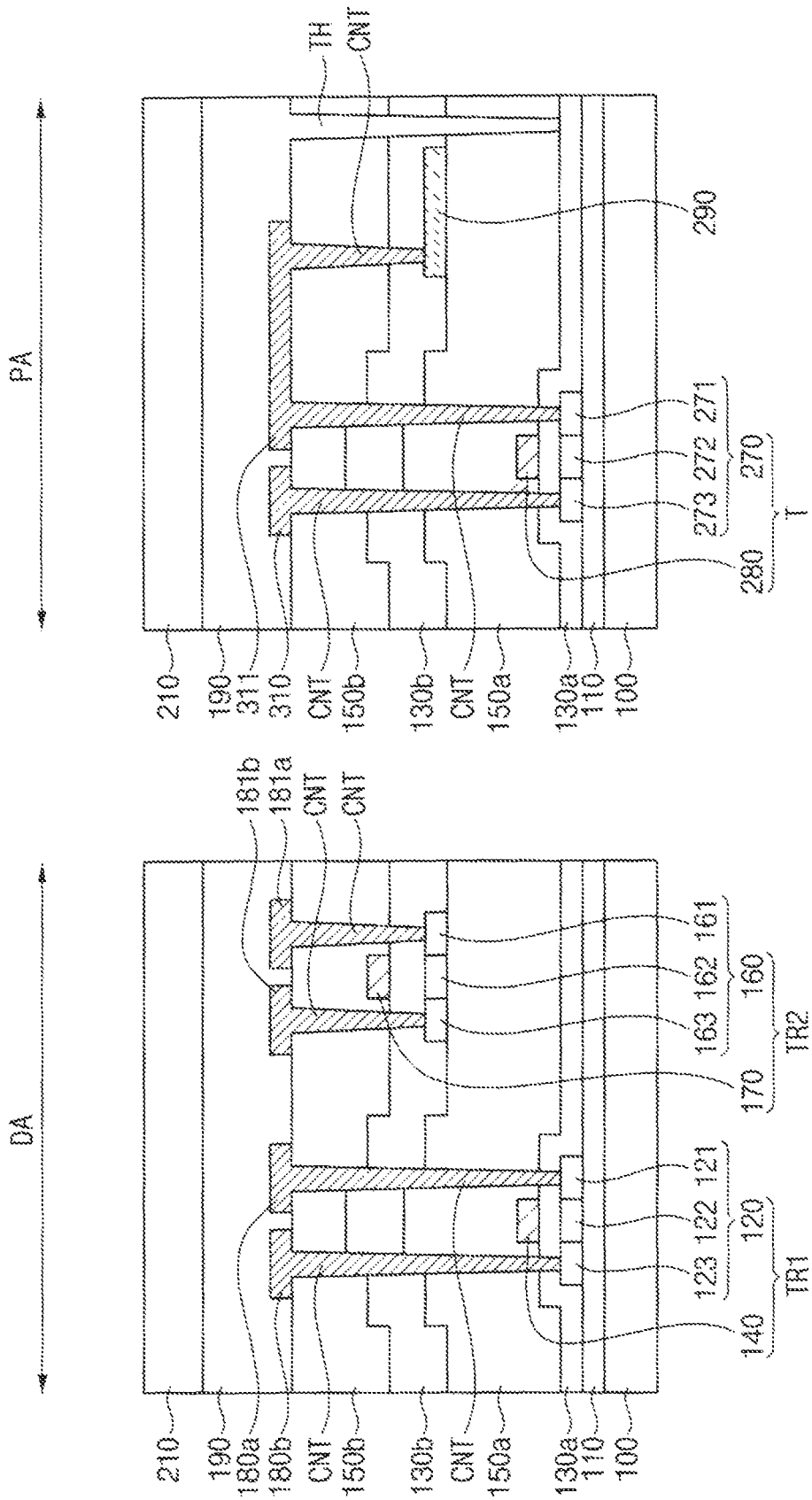

Referring to FIG. 13, the passivation layer 190 may be formed on the second interlayer insulating layer 150b. In other words, the passivation layer 190 may be entirely formed in the display area DA and the peripheral area PA. The passivation layer 190 may cover the first source electrode 180a, the first drain electrode 180b, the second source electrode 181a, and the second drain electrode 181b in the display area DA. The passivation layer 190 may cover the first electrode 310 and the second electrode 311 in the peripheral area PA. The passivation layer 190 may be formed using an insulating material. For example, the passivation layer 190 may be formed using silicon oxide, silicon nitride, and the like.

The via layer 210 may be formed on the passivation layer 190. In other words, the via layer 210 may be entirely formed in the display area DA and the peripheral area PA. For example, the via layer 210 may be formed using an organic insulating material, and the like. For example, the via layer 210 may be formed using a phenol resin, an acrylic resin, a polyimide resin, a polyamide resin, a siloxane resin, an epoxy resin, and the like.

Figure 14:
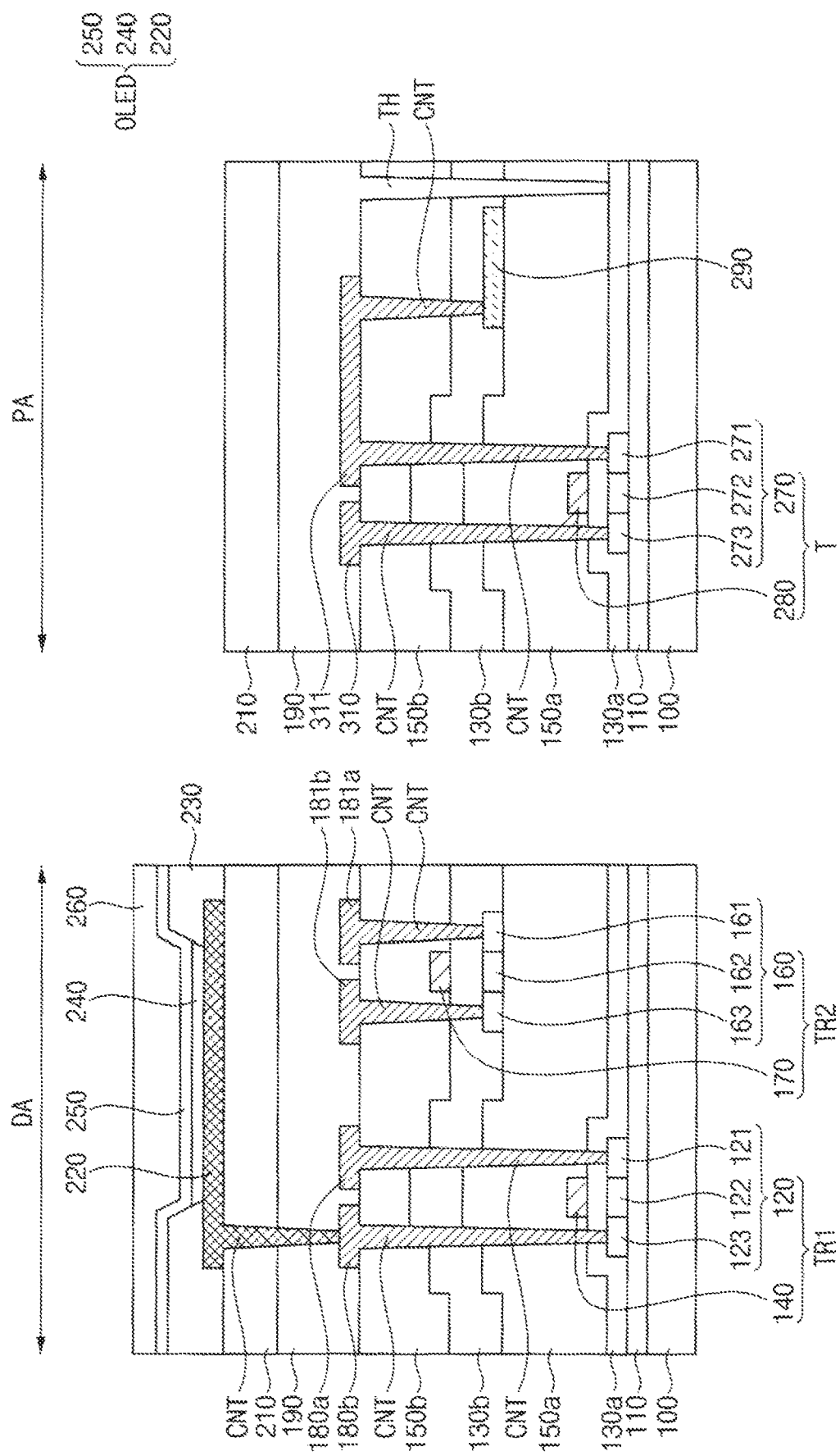

Referring to FIG. 14, the lower electrode 220 may be formed in the display area DA on the via layer 210. The lower electrode 220 may be connected to the first drain electrode 180b through a contact hole CNT formed by removing a portion of the passivation layer 190 and the via layer 210. For example, the lower electrode 220 may be formed using a metal, an alloy, a metal nitride, a conductive metal oxide, a transparent conductive material, and the like. These may be used alone or in combination with each other.

The pixel defining layer 230 may be formed in the display area DA on the via layer 210. An opening exposing a portion of the lower electrode 220 is defined or formed in the pixel defining layer 230. For example, the pixel defining layer 230 may be formed using an organic insulating material.

In an embodiment, when forming the pixel defining layer 230, hydrogen (H2) in an inorganic insulating layer (e.g., the first interlayer insulating layer 150a, the second interlayer insulating layer 150b, the passivation layer 190, and the like) may flow into the resistance line 290 through the through portion TH in the peripheral area PA. For example, the strength of hydrogen in the resistance line 290 may be about 850 to about 1,100 counts/sec. Alternatively, when the through portion TH adjacent to the resistance line 290 is not formed, hydrogen does not flow into the resistance line 290, and the strength of hydrogen in the resistance line 290 is about 550 to about 690 counts/sec. Accordingly, the resistance value of the resistance line 290 may be adjusted according to the strength of hydrogen in the resistance line 290.

The emission layer 240 may be formed on the lower electrode 220. The emission layer 240 may be formed using at least one of light emitting materials capable of emitting red light, green light, and blue light. The emission layer 240 may include a hole injection layer, a hole transport layer, an organic emission layer, an electron transport layer, an electron injection layer, and the like. For example, the emission layer 240 may be formed using a low molecular weight organic compound or a high molecular weight organic compound.

The upper electrode 250 may be formed on the pixel defining layer 230 and the emission layer 240. For example, the upper electrode 250 may be formed using a metal, an alloy, a metal nitride, a conductive metal oxide, a transparent conductive material, and the like. These may be used alone or in combination with each other.

The encapsulation layer 260 may be formed on the upper electrode 250. The encapsulation layer 260 may have a stacked structure of an inorganic layer and an organic layer. For example, the organic layer may be formed using a cured polymer such as polyacrylate. For example, the inorganic layer may be formed using silicon oxide, silicon nitride, silicon carbide, aluminum oxide, tantalum oxide, hafnium oxide, zirconium oxide, titanium oxide, and the like.

Accordingly, the display device 1000 of FIG. 1 may be fabricated.

The present disclosure may be applied to various display devices including a display device. For example, the present disclosure may be applicable to numerous display devices such as display devices for vehicles, ships and aircraft, portable communication devices, display devices for exhibition or information transfer, medical display devices, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display device comprising:
a driving transistor disposed in a display area;
a test transistor disposed in a peripheral area adjacent to the display area; and
a resistance line disposed in the peripheral area, electrically connected to the test transistor, and including a metal oxide,
wherein the test transistor comprises an active layer that is disposed on a different layer than the resistance line.

2. The display device of claim 1, wherein the resistance line includes indium-gallium-zinc oxide (IGZO).

3. The display device of claim 1, further comprising:
an inorganic insulating layer covering the resistance line and including at least one through portion adjacent to the resistance line.

4. The display device of claim 3, wherein the through portion is filled with an insulating material.

5. The display device of claim 1, wherein the resistance line is doped with a P-type impurity.

6. The display device of claim 5, wherein the resistance line is doped with boron.

7. The display device of claim 1, wherein the resistance line includes a first crack detection line and a second crack detection line disposed in the peripheral area.

8. The display device of claim 7, wherein the resistance line has a shape surrounding the display area when viewed from a plan view.

9. The display device of claim 8, wherein at least a portion of the resistance line has a zigzag shape on a plan view.

10. The display device of claim 1, wherein a distance between the through portion and the resistance line is about 10 µm or less.

11. A display device comprising,
a driving transistor disposed in a display area;
a test transistor disposed in a peripheral area adjacent to the display area; and
a resistance line disposed in the peripheral area, electrically connected to the test transistor, and including a metal oxide,
wherein the test transistor includes:
an active layer including silicon; and
a gate electrode disposed on the active layer.

* * * * *